US012804847B2

(12) United States Patent
Huang

(10) Patent No.: US 12,804,847 B2
(45) Date of Patent: Nov. 17, 2026

(54) COLD PLATE AND LIQUID COOLER HAVING SAME

(71) Applicant: Tsung-Hsien Huang, I-Lan Hsien (TW)

(72) Inventor: Tsung-Hsien Huang, I-Lan Hsien (TW)

( * ) Notice: Subject to any disclaimer, the term of this patent is extended or adjusted under 35 U.S.C. 154(b) by 122 days.

(21) Appl. No.: 19/064,503

(22) Filed: Feb. 26, 2025

(65) Prior Publication Data

US 2026/0006745 A1 Jan. 1, 2026

(30) Foreign Application Priority Data

Jun. 27, 2024 (TW) ................................ 113123967

(51) Int. Cl.
*H05K 7/20* (2006.01)

(52) U.S. Cl.
CPC ................................ *H05K 7/20254* (2013.01)

(58) Field of Classification Search
CPC . H05K 7/20254; H10W 40/226; H10W 40/73
USPC ........................................................ 165/80.4
See application file for complete search history.

(56) References Cited

U.S. PATENT DOCUMENTS

| | | | | |
|---|---|---|---|---|
| 10,157,814 | B1 * | 12/2018 | Meijer | H10W 40/22 |
| 11,856,728 | B2 * | 12/2023 | Chen | H05K 7/20236 |
| 2022/0095476 | A1 * | 3/2022 | Heydari | H05K 7/20772 |
| 2022/0418156 | A1 * | 12/2022 | Cushen | H05K 7/20772 |
| 2024/0138104 | A1 * | 4/2024 | Shelnutt | F28F 19/02 |
| 2024/0210129 | A1 * | 6/2024 | Korta | F28D 1/05358 |
| 2026/0006745 | A1 * | 1/2026 | Huang | H05K 7/20254 |

* cited by examiner

*Primary Examiner* — Steve S Tanenbaum

(74) *Attorney, Agent, or Firm* — Che-Yang Chen; Law Office of Michael Chen

(57) ABSTRACT

The present invention discloses a cold plate and a liquid cooler having the cold plate. The cold plate includes a cold plate body, an inlet and outlet liquid box and a heat conducting plate, which are used to form a liquid cooler with a liquid cooling radiator and two liquid pipes. The liquid cooling radiator can output a cooling liquid into a long diversion groove in the cold plate body. The diversion groove evenly guides the cooling liquid to a plurality of cross-flow grooves on a heat conducting plate for heat exchange and then flows from both ends of the cross-flow grooves to the long liquid outlet holes on both sides, thereby achieving the purpose of uniform heat dissipation and reducing the volume of the cold plate.

10 Claims, 9 Drawing Sheets

COLD PLATE AND LIQUID COOLER HAVING SAME

BACKGROUND OF THE INVENTION

1. Field of the Invention

The present invention relates to the field of cooling and heat dissipation technology for chip processors, and more particularly to a cold plate and a liquid cooler having the cold plate.

2. Description of the Related Art

The current discrete liquid cooler for computer processors, such as that shown in U.S. Pat. No. 10,816,279B2, has a cold plate, a liquid cooling radiator, and a cold liquid inlet pipe and a hot liquid outlet pipe connected to the cold plate and the liquid cooling radiator. The cold plate is provided with a liquid pump, which is used to circulate the liquid between the cold and the liquid cooling radiator. When the cold liquid enters the cold plate, it can cool the chip processor and heat up to become hot liquid. The hot liquid then flows to the liquid cooling radiator to dissipate heat and become cold liquid. In this circulation method, the cooling and heat dissipation functions are achieved. Other similar prior arts are shown in, for example, U.S. Pat. Nos. 7,916,483B2, 9,689,627B2, 9,807,906B2, 10,883,518B2, 11,980,011B2, US20040182544A1, and US20050210906A1.

The internal structure of the cold plate of the above-mentioned liquid cooler easily causes the flow direction of the cold liquid to be disordered after entering, and the hot liquid and the cold liquid are mixed together, resulting in uneven cooling. Although some cold plates are equipped with a vapor chamber, the numerous through holes on the vapor chamber easily block the flow of coolant to the heat exchange space below, thus affecting the cooling effect. In addition, the prior art is to install the liquid pump on the cold plate, which will cause the cold plate to be too large and difficult to install in the narrow space above the processor. Moreover, when the liquid pump fails or has other problems, the entire cold plate must be removed from the motherboard for maintenance, causing a lot of inconvenience.

SUMMARY OF THE INVENTION

The main object of the present invention is to provide a cold plate and a liquid cooler having the cold plate. Through the internal structural design of the cold plate, when the cold liquid flows into the cold plate, it first passes through a long diversion groove to evenly guide the cold liquid to the multiple cross-flow grooves of the heat conducting plate below, so that the cold liquid can exchange heat in the multiple cross-flow grooves. After the cold liquid is exchanged with hot liquid, it will flow out from the long liquid outlet holes on both sides of the heat conducting plate. The present invention enables the liquid flowing into the cold plate to flow through the internal heat exchange structure uniformly, directionally and quantitatively, so that there will be no turbulence of cold and hot liquids during the liquid circulation, and there will be no structure that hinders the circulation.

A second object of the present invention is to provide a cold plate and a liquid cooler having the cold plate, wherein the cold plate is designed to be free of a liquid pump and the liquid pump is installed on a liquid cooling radiator, so that the volume of the cold plate is reduced, which is conducive to installation on a motherboard with a limited space. If the liquid pump has a maintenance failure or needs to be upgraded or replaced, the cold plate does not need to be removed.

DETAILED DESCRIPTION OF THE PREFERRED EMBODIMENT

Figure 1:
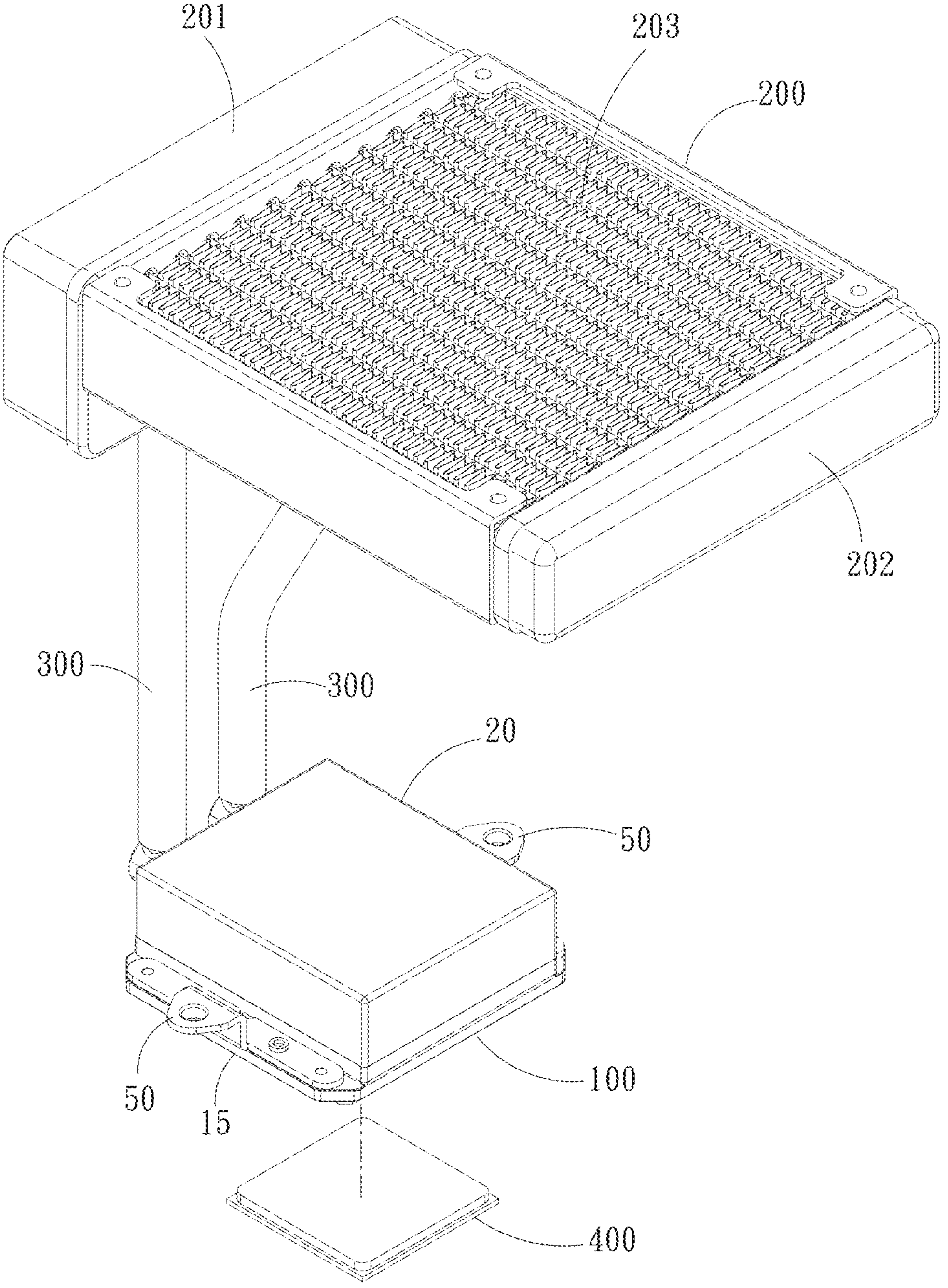
FIG. 1 is a front view schematic diagram of a liquid cooler with a cold plate according to the present invention.
Figure 2:
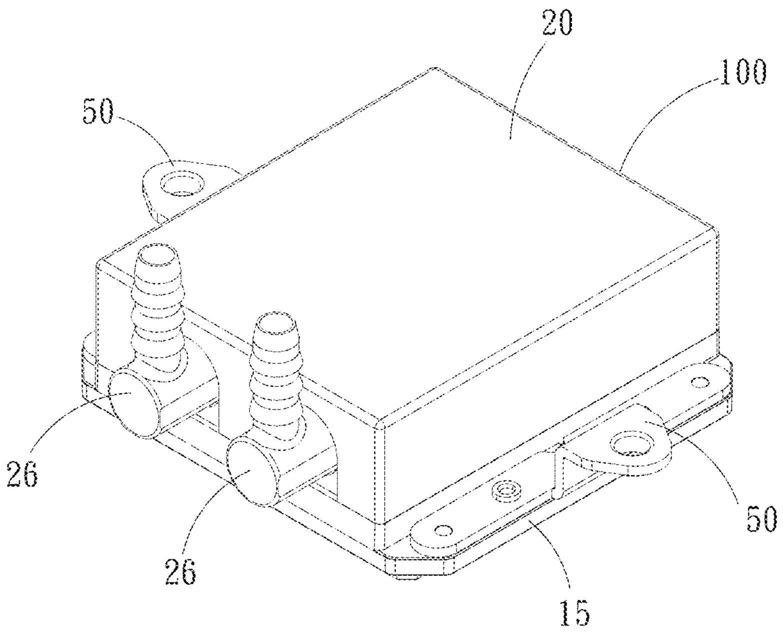
FIG. 2 is a three-dimensional schematic diagram of the cold plate of the present invention.
Figure 3:
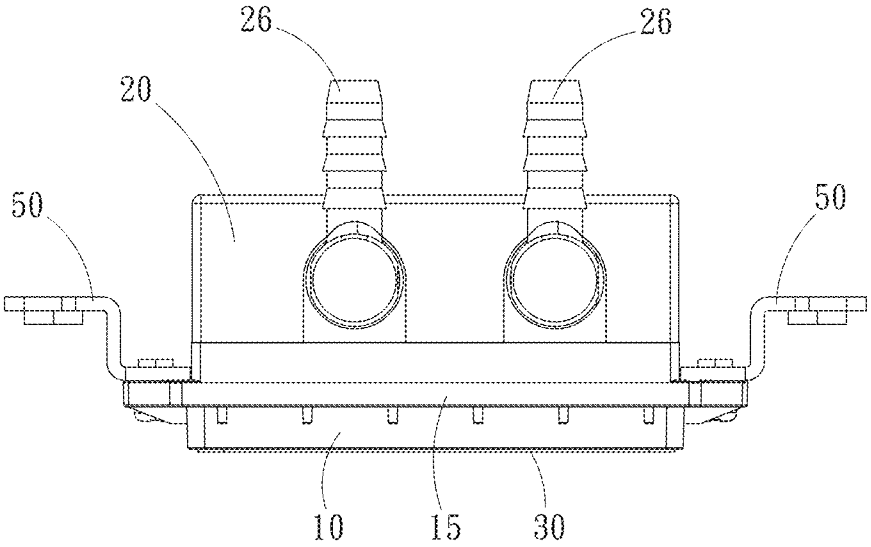
FIG. 3 is a rear-view schematic diagram of the cold plate of the present invention.
Figure 4:
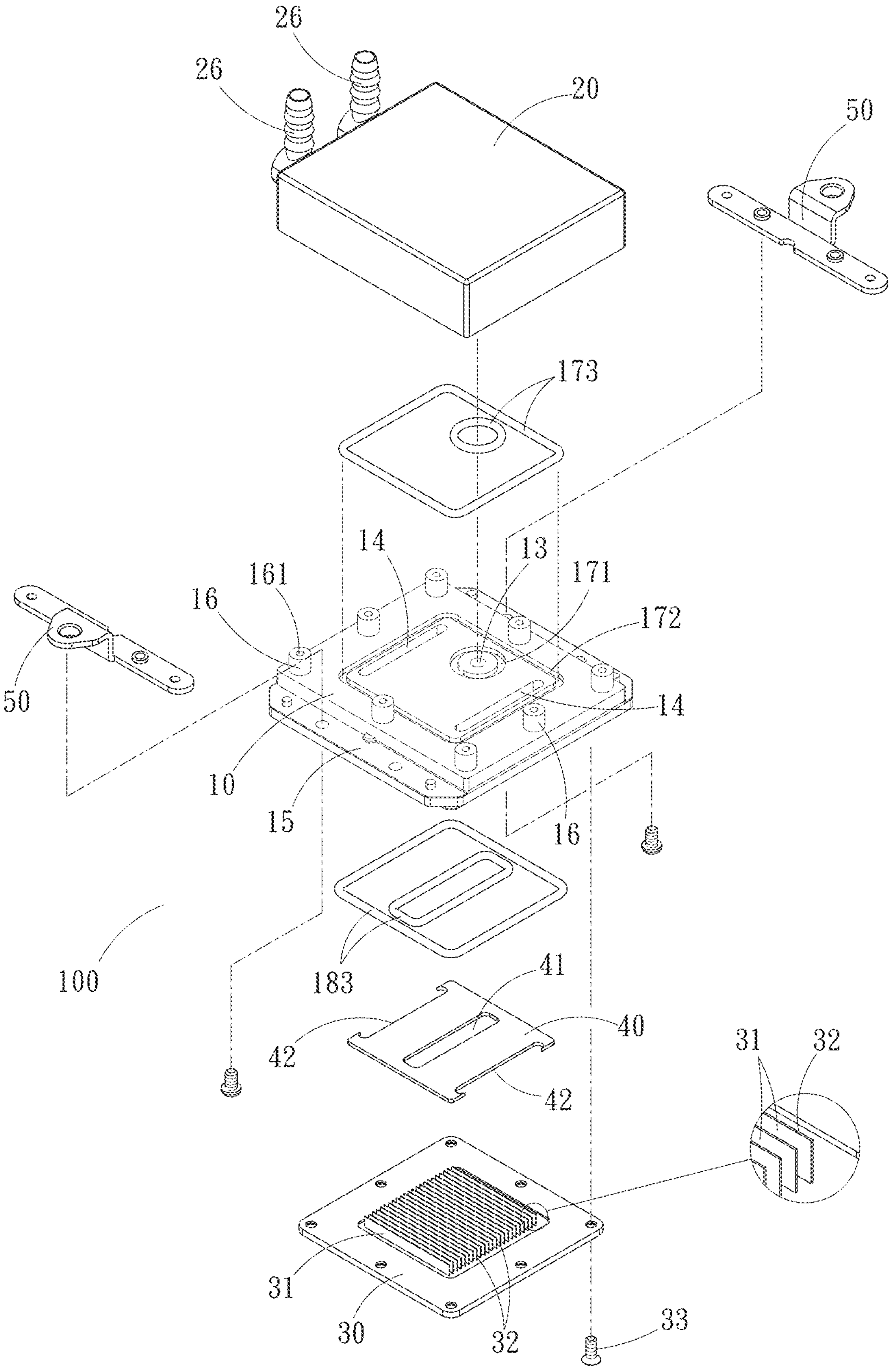
FIG. 4 is a top view schematic diagram of the cold plate of the present invention.
Figure 5:
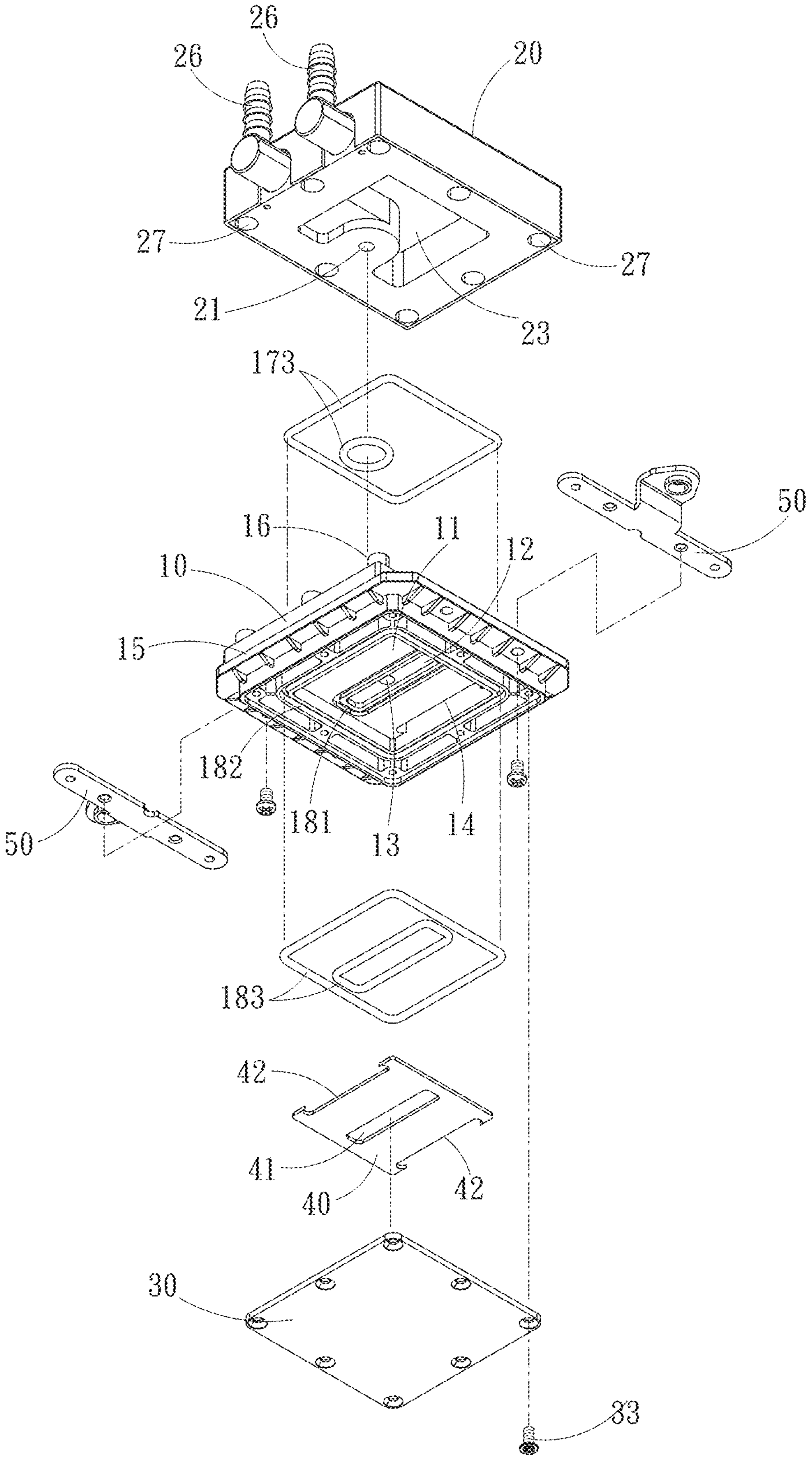
FIG. 5 is a bottom exploded view of the cold plate of the present invention.

Referring to FIGS. 1, 2 and 3, the present invention provides a cold plate. The cold plate 100 is used to be disposed on a chip processor 400, and cools the chip processor 400 through liquid, and allows the liquid to take away the heat of the chip processor 400. Referring to FIGS. 4 and 5, the preferred embodiment of the cold plate 100 comprises a cold plate body 10, an inlet and outlet liquid box 20 and a heat conducting plate 30, and a liquid isolating sheet 40 and two fixing brackets 50 may be added.

The cold plate body 10 is a component used for fixing and heat exchange. The preferred embodiment is a rectangular corrosion-resistant plastic seat body, and a rectangular guide chamber 11 is provided on the bottom surface thereof and is recessed toward the top surface thereof. A diversion groove 12 is provided in the middle of the top wall of the guide chamber 11 and is further recessed toward the top surface of the cold plate body 10. The diversion groove 12 is implemented as a long strip groove extending toward two opposite sides of the guide chamber 11. The top wall of the diversion groove 12 is provided with a first liquid inlet hole 13, and the first liquid inlet hole 13 is connected to the top surface of the cold plate body 10. Two first liquid outlet holes 14 are respectively disposed on each of both sides of the top wall of the guide chamber 11 opposite to the diversion groove 12. The first liquid outlet holes 14 are preferably a strip-shaped hole. The first liquid outlet holes 14 are respectively connected to the top surface of the cold plate body 10. The cold plate body 10 is further provided with a boss portion 15, and two corresponding sides of the boss portion 15 are respectively provided with a fixing bracket 50, and the fixing brackets 50 are used to be fixed on the circuit board (mainboard) through known fixing elements.

The inlet and outlet liquid box 20 is combined with the cold plate body 10 to allow liquid to flow into and out of the cold plate body 10. Specifically, the inlet and outlet liquid box 20 is combined on the top surface of the cold plate body 10 and has a second liquid inlet hole 21 and a second liquid outlet hole 22. An inlet end of the second liquid inlet hole 21 is connected to any side of the inlet and outlet liquid box 20, and an outlet end of the second liquid inlet hole 21 is located at the bottom of the inlet and outlet liquid box 20 and is used to connect to the inlet end of the first liquid inlet hole 13 of the cold plate body 10. An outlet end of the second liquid outlet hole 22 is connected to any side of the inlet and outlet liquid box 20, and an inlet end of the second liquid outlet hole 22 is located at the bottom surface or other position of the inlet and outlet liquid box 20, and is used to connect to the outlet ends of the first liquid outlet holes 14 of the cold plate body 10. The bottom surface of the inlet and outlet liquid box 20 is provided with a liquid outlet cavity 23 which is concave toward the top surface thereof. The bottom surface of the liquid outlet cavity 23 covers the two first liquid outlet holes 14, so that the liquid in the two first liquid outlet holes 14 can flow into the liquid outlet cavity 23 and then into the second liquid outlet hole 22. The inlet end of the second liquid outlet hole 22 is located at the inner wall of the liquid outlet cavity 23.

Figure 7:
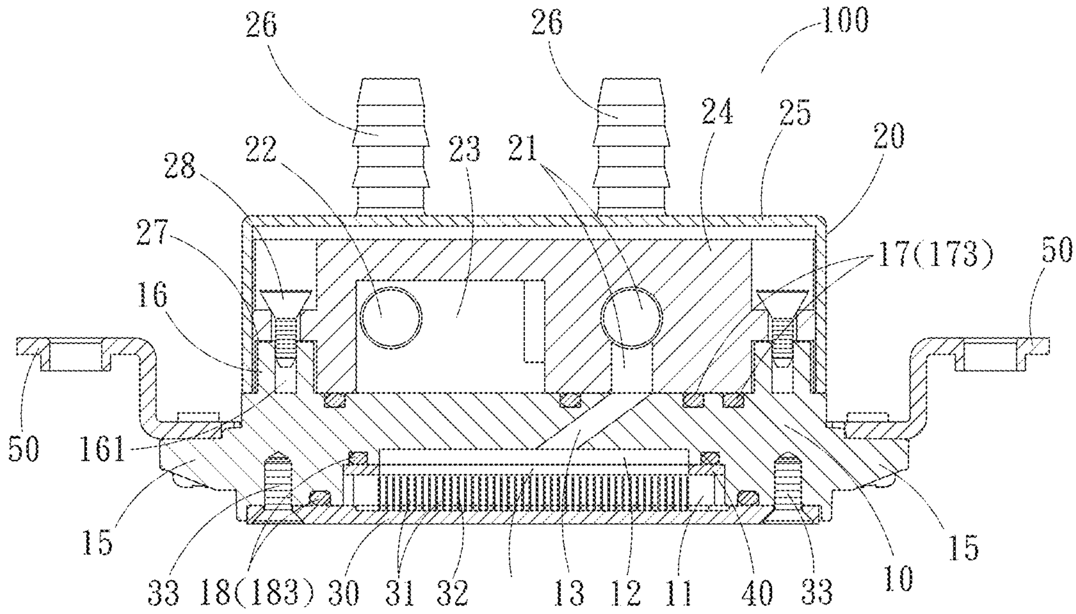
FIG. 7 is a schematic diagram of the longitudinal forward section of the cold plate of the present invention.
Figure 8:
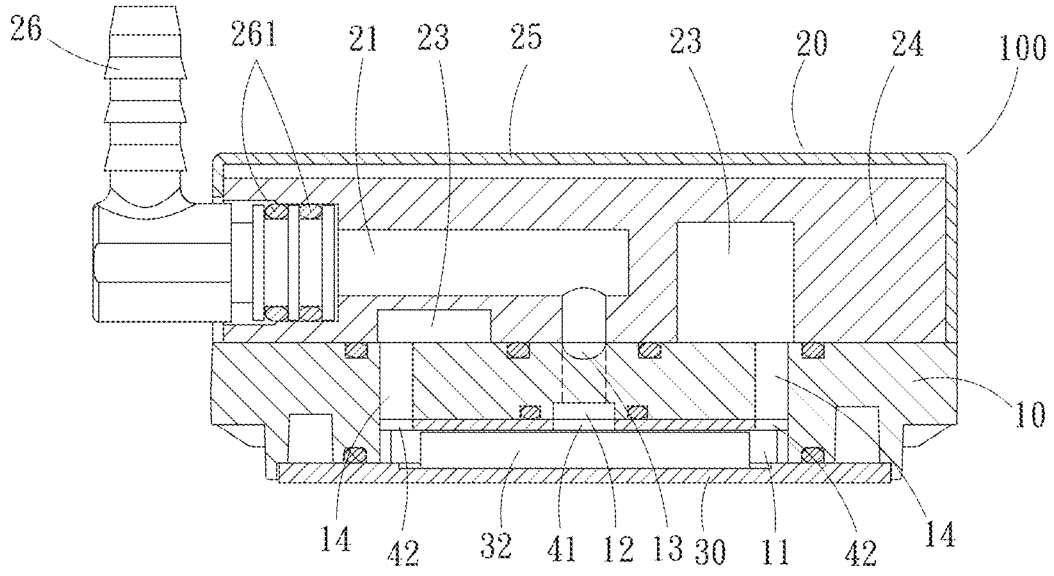
FIG. 8 is a schematic diagram of the longitudinal side section of the cold plate of the present invention.
Figure 9:
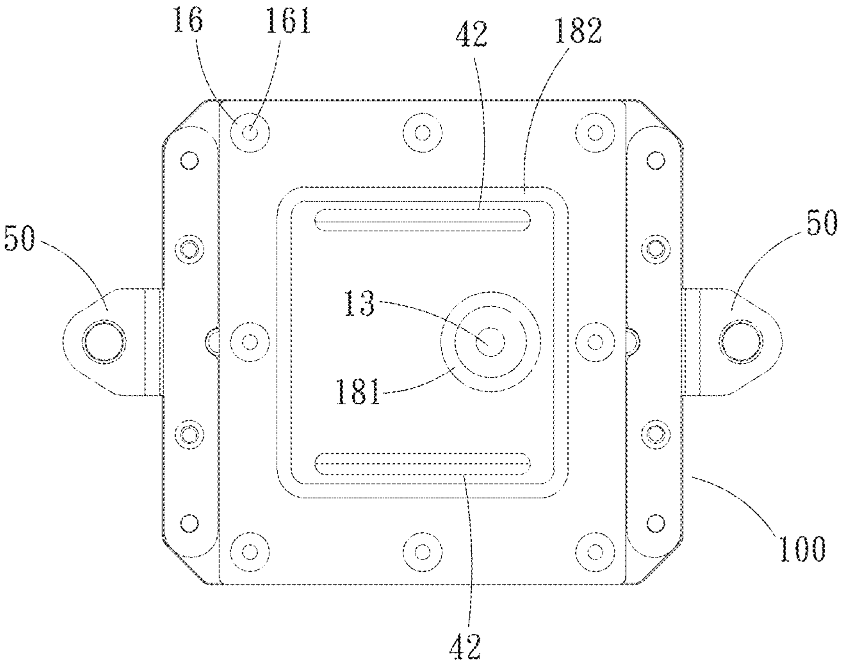
FIG. 9 is a schematic top view of the cold plate body of the cold plate of the present invention.
Figure 10:
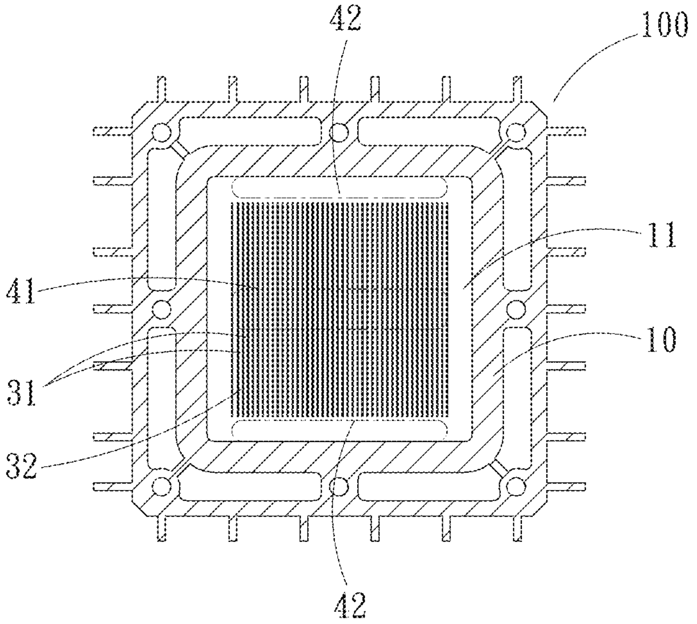
FIG. 10 is a schematic cross-sectional view of the cold plate body of the cold plate of the present invention.

Referring to FIGS. 4, 5 and 7, the heat conducting plate 30 is a heat conducting metal plate whose bottom surface is used to contact the chip processor 400. It is locked to the bottom surface of the cold plate body 10 through a plurality of screws 33 on the edge and covers and seals the guide chamber 11. The top of the heat conducting plate 30 has a plurality of parallel cross-flow grooves 31 and fins 32 between the cross-flow grooves 31. When the heat conducting plate 30 is combined with the bottom surface of the cold plate body 10, the cross-flow grooves 31 and the fins 32 are located in the guide chamber 11 of the cold plate body 10, and the length direction of the cross-flow grooves 31 is perpendicular to the length direction of the diversion groove 12 (as shown in FIG. 9). The cross-flow grooves 31 extend to the corresponding sides of the heat conducting plate 30 so that the two ends of the cross-flow groove 31 can be connected to the first liquid outlet holes 14 above the two ends thereof (as shown in FIG. 8). The first liquid outlet holes 14 are strip holes with a width greater than or equal to the total width of the cross-flow grooves 31 (as shown in FIGS. 9 and 10), so that the liquid in each cross-flow groove 31 can flow into the first liquid outlet holes 14 at a constant speed. Therefore, when the cooling liquid flows into the diversion groove 12 through the first liquid inlet hole 13, the diversion groove 12 can be designed as a long strip groove, so that the liquid flows evenly into the middle of the cross-flow grooves 31 and then flows to the first liquid outlet holes 14 at both ends. When the liquid flows in the cross-flow grooves 31, it can evenly exchange heat with the heat conducting plate 30 and the fins 32 to cool the chip processor 400.

Referring to FIG. 4, FIG. 5 and FIG. 7, the present invention may further comprise a liquid isolating sheet 40, which is a rectangular sheet having a shape and size corresponding to the guide chamber 11. The liquid isolating sheet 40 has a first through hole 41 in the middle thereof corresponding to the diversion groove 12, and two second through holes 42 in the sides thereof corresponding to the first liquid outlet holes 14. The first through holes 41 and the second through holes 42 are both bar-shaped holes. During assembly, the liquid isolating sheet 40 is covered on the cross-flow grooves 31 of the heat conducting plate 30 to ensure that the liquid flowing into each cross-flow grooves 31 can flow out to both ends of the cross-flow grooves 31, thereby preventing the liquid that has been heated by heat exchange from mixing with the cold liquid due to turbulence in the flow process.

Figure 6:
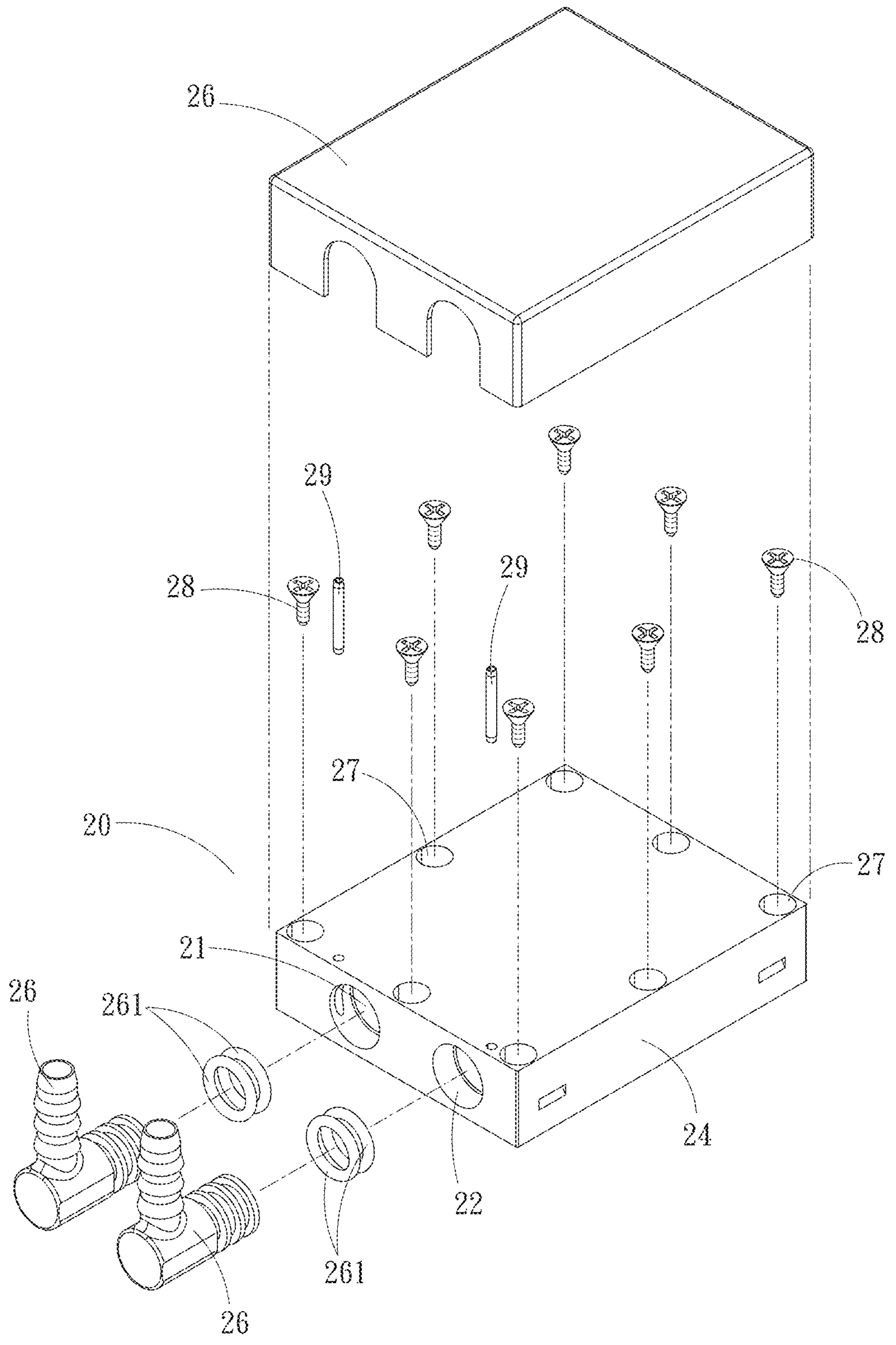
FIG. 6 is a schematic diagram of the disassembled inlet and outlet liquid box of the cold plate of the present invention.

Referring to FIG. 6, the preferred embodiment of the inlet and outlet liquid box 20 comprises an inlet and outlet liquid box body 24, a housing 25 and two pipe connectors 26. The inlet and outlet liquid box body 24 is a rectangular block. The inlet and outlet liquid box body 24 is provided with the second liquid inlet hole 21 and the second liquid outlet hole 22. The bottom surface of the inlet and outlet liquid box body 24 is provided with the liquid outlet cavity 23. The housing 25 is a rectangular cover having a top panel and surrounding side panels. The housing 25 is sleeved on the inlet and outlet liquid box body 24 to cover the inlet and outlet liquid box body 24. The pipe connectors 26 are connected to the inlet at the end of the second liquid inlet hole 21 and the outlet end of the second liquid outlet hole 22. The top surface of the cold plate body 10 is provided with a plurality of positioning columns 16 and screw holes 161 on the positioning columns 16. The inlet and outlet liquid box 20 (inlet and outlet liquid box body 24) is provided with a plurality of positioning holes 27 and screws 28 passing through the positioning holes 27. During assembly, the pipe columns 16 of the cold plate body 10 are inserted into the positioning holes 27 of the inlet and outlet liquid box 20 (inlet and outlet liquid box body 24), and the screws 28 are locked into the screw holes 161 on the pipe columns 16 from top to bottom. Then, the housing 25 is set on the inlet and outlet liquid box body 24, so that the surface of the entire inlet and outlet liquid box 20 remains flat and beautiful, and dust can be prevented from accumulating in the positioning holes 27. In addition, the inlet and outlet liquid box body 24 may be provided with two latches 29, each latch 29 passes through the second liquid inlet hole 21 and the second liquid outlet hole 22, so that they are respectively stuck in the grooves of the pipe connectors 26, so that the pipe connectors 26 cannot be detached.

In order to achieve the effect of leak prevention, the present invention provides a leak prevention structure 17 between the joint surfaces of the cold plate body 10 and the inlet and outlet liquid box 20, wherein a first groove 171 surrounding the inlet end of the first liquid inlet hole 13 and a second groove 172 surrounding the two first liquid outlet holes 14 are concavely provided on the top surface of the cold plate body 10, and a leak-proof ring 173 is provided on the first groove 171 and the second groove 172 respectively. A leak prevention structure 18 is also provided between the cold plate body 10, the heat conducting plate 30 and the liquid isolating sheet 40. A third groove 181 is provided around the diversion groove 12 on the bottom surface of the cold plate body 10, and a fourth groove 182 is provided around the guide chamber 11. A leak-proof ring 183 is provided in the third groove 181 and the fourth groove 182 respectively. In addition, one or two O-rings 261 may be disposed around the plug-in portion of the pipe connectors 26 to make the entire cold plate 100 leak-proof.

Figure 11:
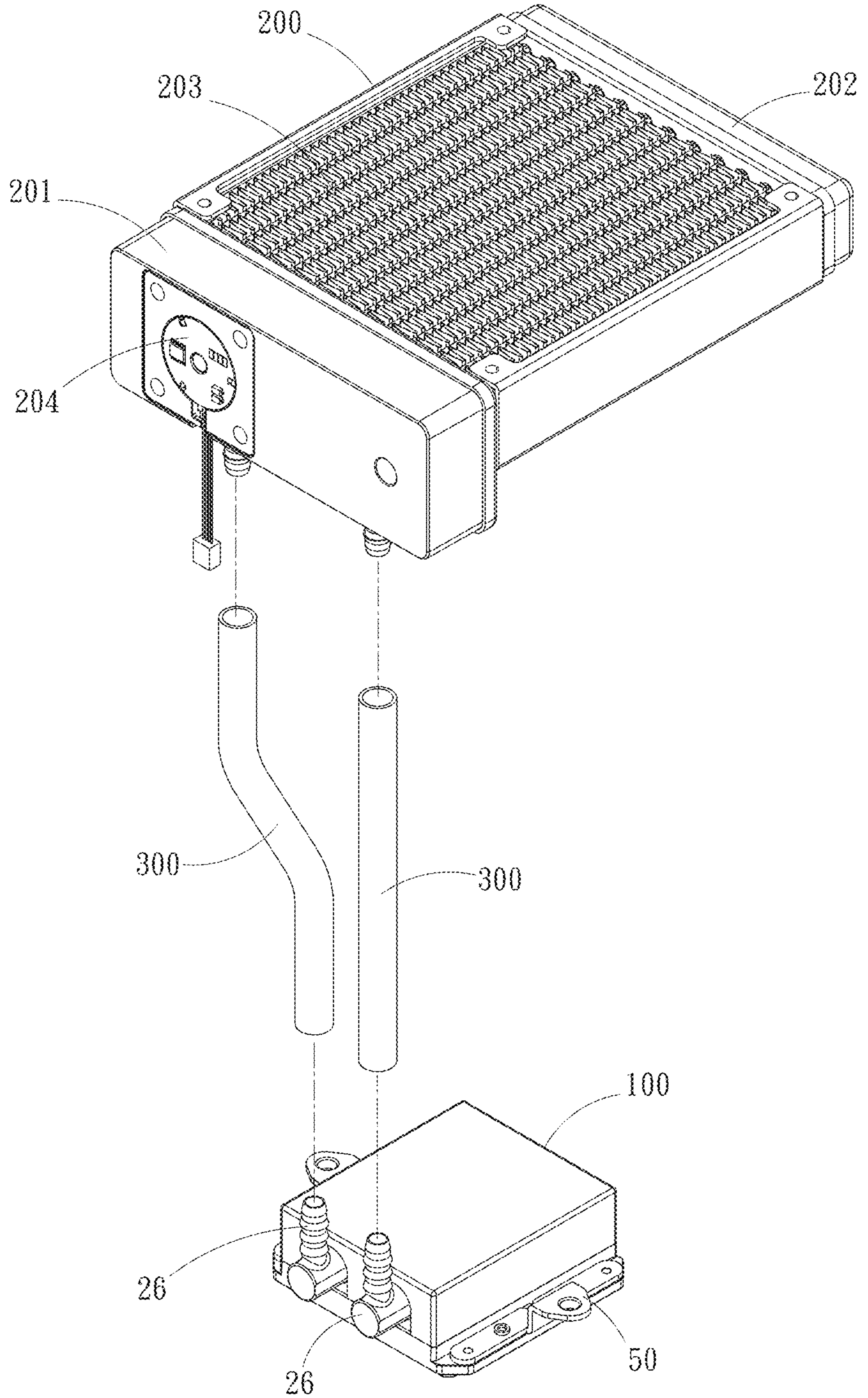
FIG. 11 is a schematic diagram of an exploded view of a liquid cooler with a cold plate according to the present invention.
Figure 12:
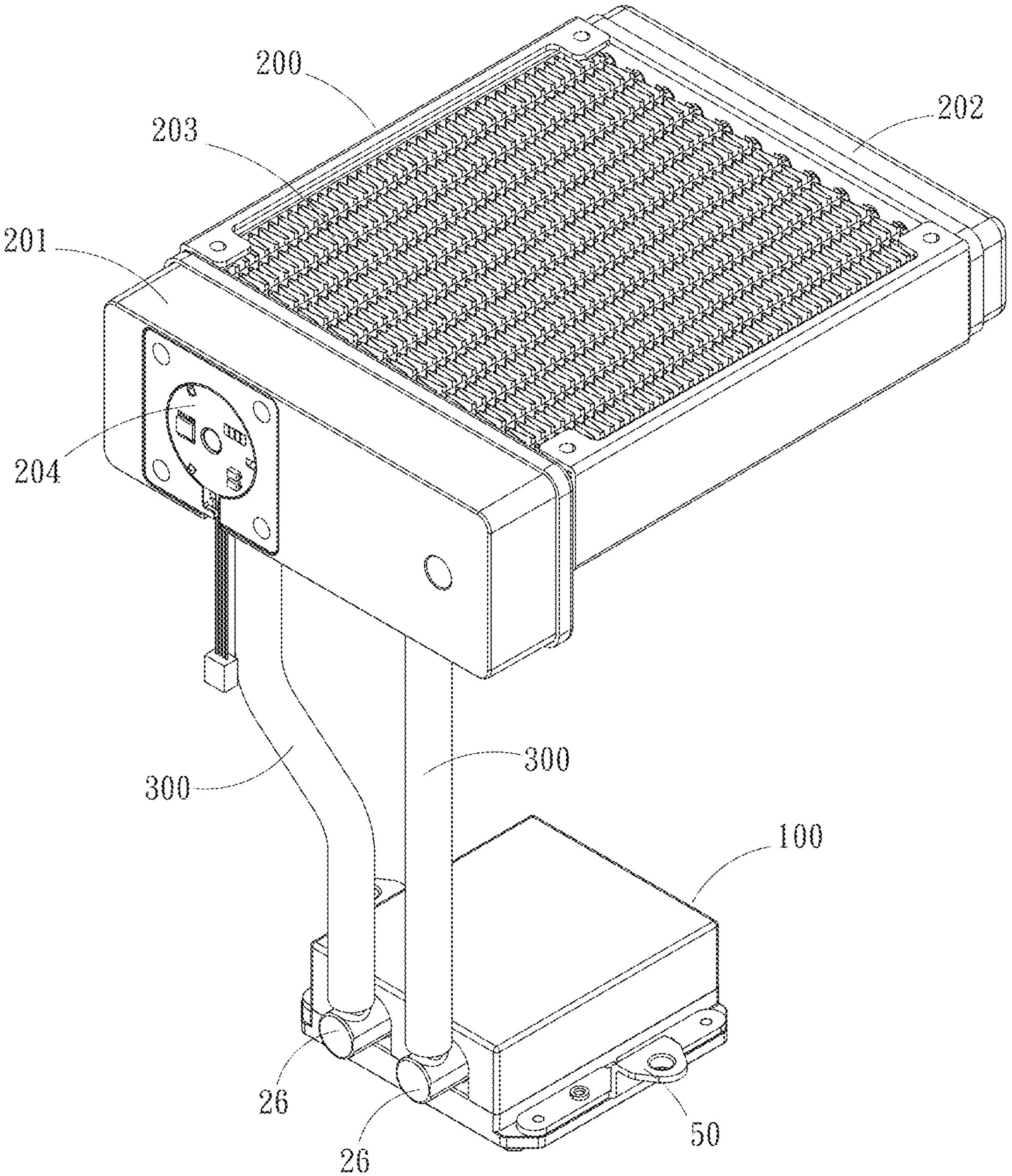
FIG. 12 is a schematic diagram of a rear view of a liquid cooler with a cold plate according to the present invention.

Referring to FIG. 11 and FIG. 12, it can be seen from the above technical features that the cold plate 100 of the present invention is a cold plate without a liquid pump. In order to apply the cold plate 100 to the chip processor 400 for cooling and heat dissipation, the present invention further proposes a liquid cooler with a cold plate, which comprises the above-mentioned cold plate 100, a liquid cooling radiator 200 and two liquid pipes 300. The liquid cooling radiator 200 is a known structure, such as the liquid cooling radiator 200 shown in the patent publication 1802996B of Taiwan or the US patent publication US20230014449A1, which comprises a first liquid box 201, a second liquid box 202, and a plurality of radiator tubes 203 connected between the first liquid box 201 and the second liquid box 202. However, the present invention changes the liquid pump of the above patent to the liquid cooling radiator 200, and a liquid pump 204 is provided in the first liquid box 201, and a liquid inlet pipe connector 205 and a liquid outlet pipe connector 206 are provided in the first liquid box 201. The two liquid pipes 300 have the respective one ends thereof respectively connected to the pipe connector 26 at the inlet end of the second liquid inlet hole 21 of the cold plate 100, and the pipe connector 26 at the outlet end of the second liquid outlet hole 22, and the respective other ends thereof respectively connected to the liquid inlet pipe connector 205 and the liquid outlet pipe connector 206 of the liquid cooling radiator 200, so that the liquid dissipated by the liquid cooling radiator 200 flows into the cold plate 100, and the hot liquid in the cold plate 100 can flow to the liquid cooling radiator 200 for heat dissipation. Thus, in addition to the above-mentioned uniform heat exchange, heat dissipation and leak prevention effects, the present invention can also reduce the overall structural volume of the cold plate 100 because the cold plate 100 does not have a liquid pump, making it convenient to install in a small computer space. When the liquid pump 204 fails, only the liquid cooling radiator 200 can be disassembled without disassembling the cold plate 100.

Although a particular embodiment of the invention has been described in detail for purposes of illustration, various modifications and enhancements may be made without departing from the spirit and scope of the invention. Accordingly, the invention is not to be limited except as by the appended claims.

The invention claimed is:

1. A cold plate, comprising:

a cold plate body, which is a corrosion-resistant plastic body, said cold plate body comprising a rectangular guide chamber provided on a bottom surface thereof and recessed toward a top surface thereof, a diversion groove provided in the middle of a top wall of said guide chamber and recessed toward the top surface of said cold plate body and extending toward two opposite sides of said guide chamber, a first liquid inlet hole located on a top wall of said diversion groove and connected to the top surface of said cold plate body, and two first liquid outlet holes respectively disposed on each of both sides of the top wall of said guide chamber and respectively connected to the top surface of said cold plate body;

an inlet and outlet liquid box attached to the top surface of said cold plate body, said inlet and outlet liquid box comprising a second liquid inlet hole and a second liquid outlet hole, said second liquid inlet hole having an inlet end thereof connected to one side of said inlet and outlet liquid box and an opposing outlet end thereof connected to said first liquid inlet hole, said second liquid outlet hole having an outlet end thereof connected to one side of said inlet and outlet liquid box and an opposing inlet end thereof connected to said first liquid outlet holes;

a heat conducting plate, which is a heat conducting metal plate a heat conducting plate combined with the bottom surface of said cold plate body to cover and seal said guide chamber, said heat conducting plate comprising a plurality of parallel cross-flow grooves located on a top surface thereof and extending to the two opposite sides of said heat conducting plate, said cross-flow grooves having two opposite ends thereof connected to said first liquid outlet holes, the length direction of said cross-flow grooves being perpendicular to the length direction of said diversion groove, so that the liquid entering said diversion groove flows into said cross-flow grooves for heat exchange, and then flows from the two ends of said cross-flow grooves to said first liquid outlet holes; and a liquid isolating sheet, said liquid isolating sheet comprising a first through hole provided in the middle thereof corresponding to said diversion groove, and two second through holes provided on two opposite sides thereof corresponding to the shape of said first liquid outlet holes, said first through hole and said second through holes being bar-shaped holes, said liquid isolating sheet covering said cross-flow grooves of said heat conducting plate.

2. The cold plate as claimed in claim 1, wherein said first liquid outlet holes are strip holes, and the width of said first liquid outlet holes is greater than or equal to the total width of said cross-flow grooves.

3. The cold plate as claimed in claim 1, wherein said cold plate body further comprises a boss portion around the border thereof, and two fixing brackets respectively located at two opposite sides of said boss portion.

4. A liquid cooler comprising a liquid cooling radiator, two liquid pipes, and a cold plate as claimed in claim 1, wherein said liquid cooling radiator comprises a first liquid box, a second liquid box, a set of radiator tubes connected between said first liquid box and said second liquid box and a liquid pump installed in said first liquid box, said first liquid box comprising a liquid inlet pipe connector and a liquid outlet pipe connector; said two liquid pipes have respective one ends thereof respectively connected to the inlet end of said second liquid inlet hole and the outlet end of said second liquid outlet hole, and respective opposite ends thereof respectively connected to said liquid inlet pipe connector and said liquid outlet pipe connector.

5. The cold plate as claimed in claim 1, wherein said inlet and outlet liquid box further comprises a liquid outlet cavity located on a bottom surface thereof said liquid outlet cavity being concave toward an opposing top surface of said inlet and outlet liquid box, the contour of said liquid outlet cavity covering said two first liquid outlet holes, and the liquid in said two first liquid outlet holes is capable of flowing into said liquid outlet cavity; the inlet end of said second liquid outlet hole is located at an inner wall of said liquid outlet cavity.

6. The cold plate as claimed in claim 5, wherein said cold plate body further comprises a plurality of pipe columns located at the top surface thereof and screw holes a plurality of respectively located on said pipe columns; said inlet and outlet liquid box further comprises a plurality of positioning holes, which accommodate said pipe columns of said cold plate body, and a plurality of screws respectively passing through the positioning holes and locked into said screw holes on said pipe columns.

7. The cold plate as claimed in claim 5, wherein said cold plate body further comprises a first groove concavely provided on the top surface thereof and surrounding the inlet end of said first liquid inlet hole, a second groove concavely provided on the top surface thereof and surrounding said two first liquid outlet holes, and two leak-proof rings respectively provided on said first groove and said second groove.

8. The cold plate as claimed in claim 5, wherein said cold plate body further comprises a third groove provided around said diversion groove on the bottom surface thereof, a fourth groove provided around said guide chamber, and two leak-proof rings respectively provided in said third groove and said fourth groove.

9. The cold plate as claimed in claim 5, wherein said inlet and outlet liquid box comprises an inlet and outlet liquid box body, a housing and two pipe connectors, said inlet and outlet liquid box body being a rectangular block and being provided with said second liquid inlet hole and said second liquid outlet hole, said inlet and outlet liquid box body having a bottom surface thereof provided with said liquid outlet cavity, said housing being a rectangular cover having a top panel and surrounding side panels, said housing being sleeved on said inlet and outlet liquid box body, said pipe connectors being connected to said second liquid inlet hole and said second liquid outlet hole.

10. The cold plate as claimed in claim 9, wherein said cold plate body further comprises a plurality of pipe columns located at the top surface thereof and screw holes a plurality of respectively located on said pipe columns; said inlet and outlet liquid box further comprises a plurality of positioning holes, which accommodate said pipe columns of said cold plate body, and a plurality of screws respectively passing through the positioning holes and locked into said screw holes on said pipe columns.

* * * * *